(12) United States Patent
Perkins et al.

(10) Patent No.: US 10,169,965 B1
(45) Date of Patent: Jan. 1, 2019

(54) PHYSICAL MESH BARRIER FOR PROTECTION OF SERVER RACK

(71) Applicant: Amazon Technologies, Inc., Seattle, WA (US)

(72) Inventors: Matthew Perkins, Shoreline, WA (US); Somasundaram Niranjayan, Issaquah, WA (US); Nihar Desai, Seattle, WA (US); Mike MacGregor, Seattle, WA (US); Benjamin Philipp Grefe, Auburn, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/719,119

(22) Filed: Sep. 28, 2017

(51) Int. Cl.
- *G08B 13/12* (2006.01)
- *H05K 7/14* (2006.01)
- *G08B 13/22* (2006.01)

(52) U.S. Cl.
CPC .......... *G08B 13/12* (2013.01); *G08B 13/22* (2013.01); *H05K 7/1488* (2013.01)

(58) Field of Classification Search
CPC ......... G08B 13/12; G08B 13/22; G06F 21/00; G06F 21/70; G06F 21/88; H05K 7/1488
See application file for complete search history.

(56) References Cited

U.S. PATENT DOCUMENTS

| | | | | | |
|---|---|---|---|---|---|
| 4,293,778 A | * | 10/1981 | Williams | ............. | G08B 13/126 307/147 |
| 5,684,671 A | * | 11/1997 | Hobbs | ................... | G06F 1/183 312/223.2 |

OTHER PUBLICATIONS

U.S. Appl. No. 15/719,159, filed Sep. 28, 2017, Titled: Electrically Detectable Separable Bar Arrangement for Protection of Server Rack.

* cited by examiner

*Primary Examiner* — Ryan Sherwin
(74) *Attorney, Agent, or Firm* — Kilpatrick Townsend & Stockton LLP

(57) ABSTRACT

A tamper detection system utilizes a barrier that includes a mesh sized to extend across a rack in an arrangement in which the mesh blocks access to an appliance received in the rack. The tamper detection system further utilizes a detector configured to log, transmit, or otherwise generate an indication that the barrier has been tampered with, such as in response to the mesh becoming severed or pulled away from the rack enough to cause a detectable change of resistance or other electrical characteristic in a corresponding circuit.

22 Claims, 6 Drawing Sheets

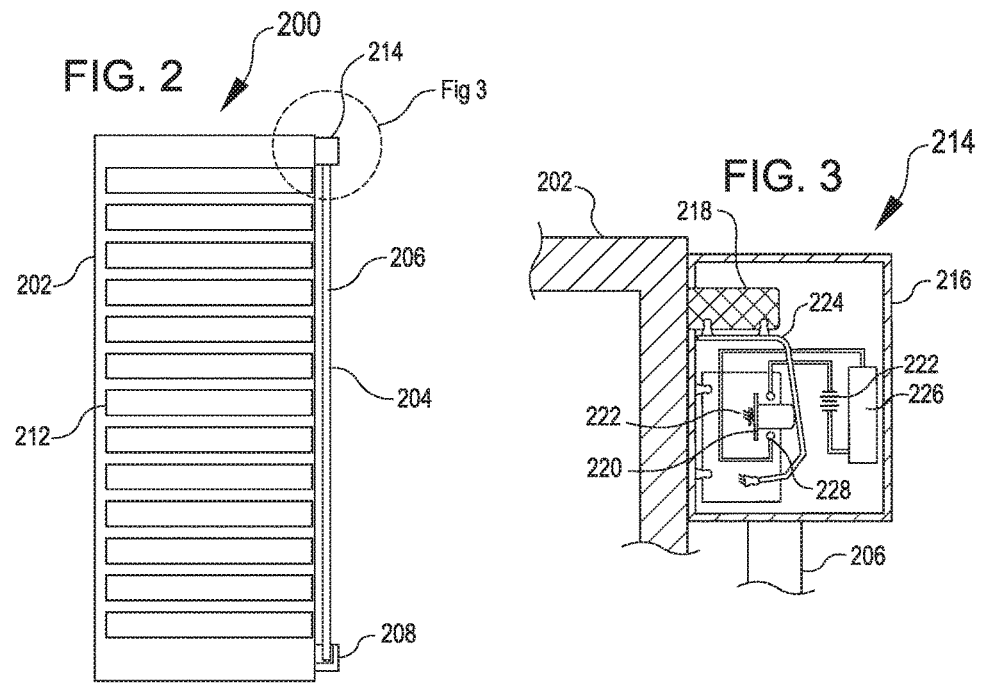
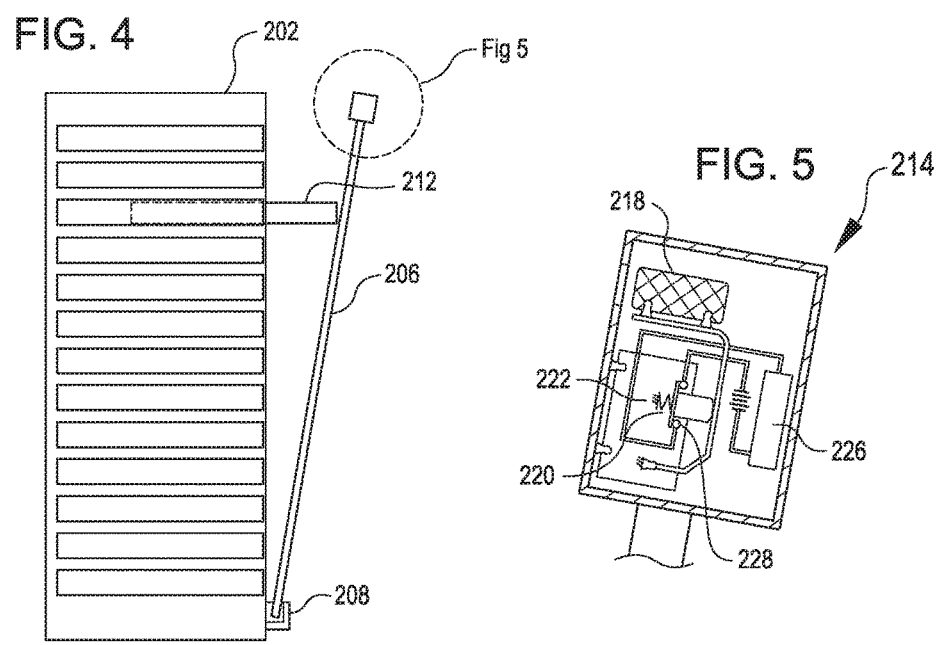

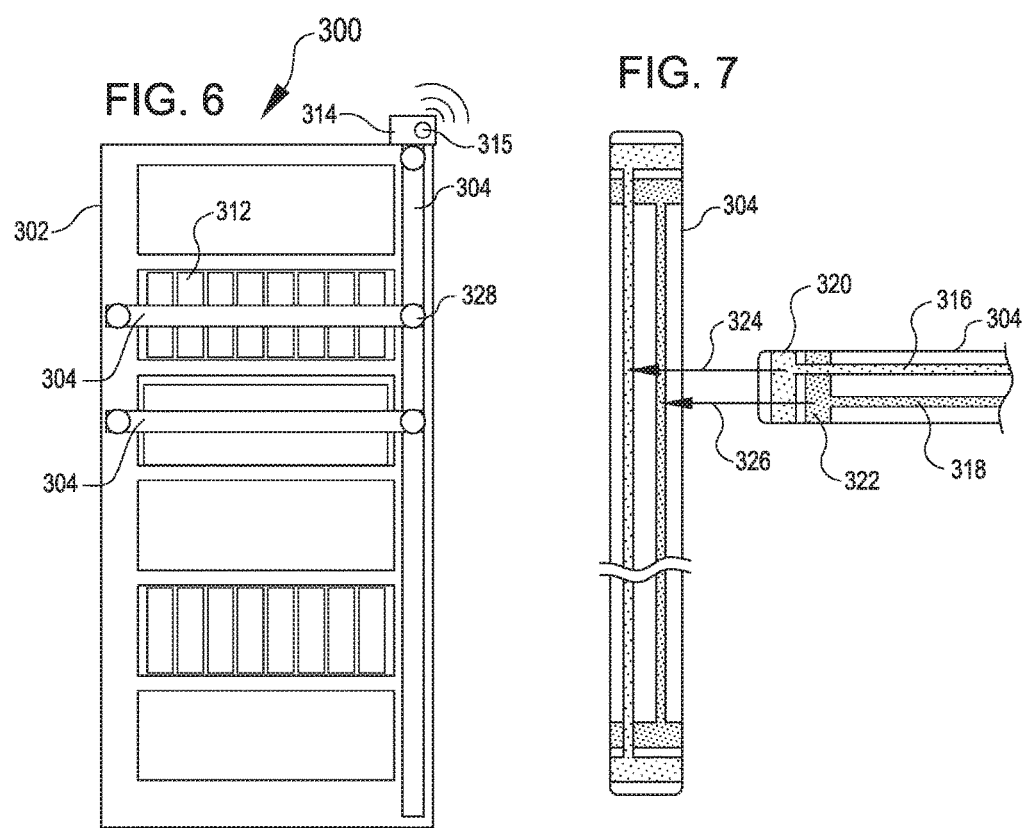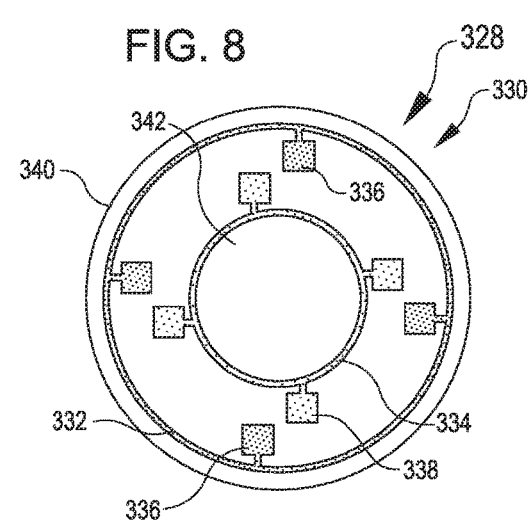

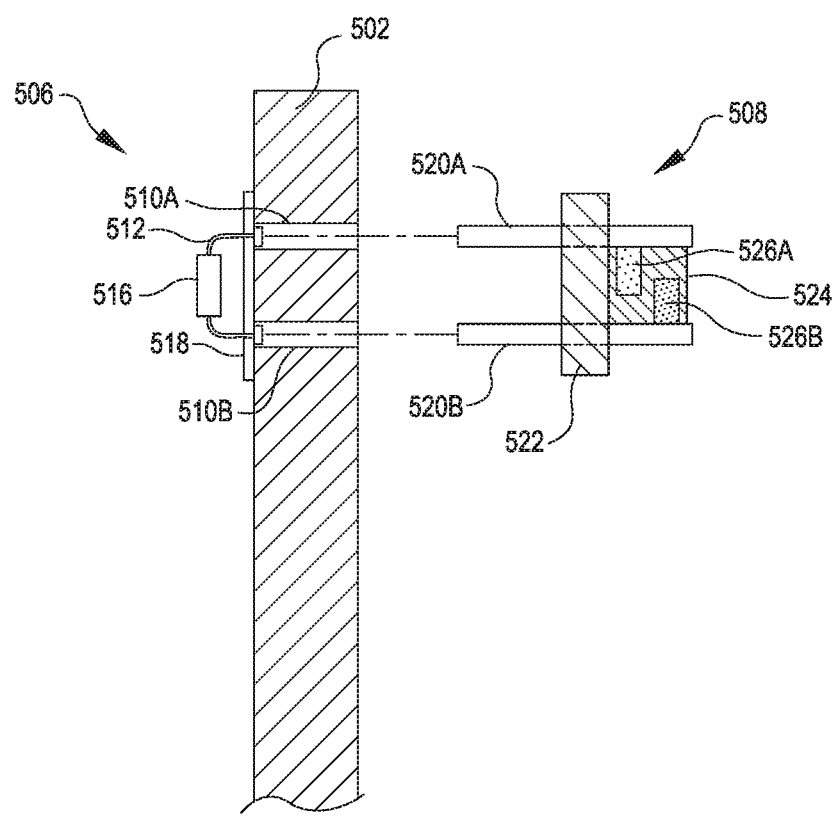

PHYSICAL MESH BARRIER FOR PROTECTION OF SERVER RACK

BACKGROUND

In an era of ever-increasing reliance on data retention within cloud computing infrastructure, physical security of computer processing assets is an important consideration. Authorization, security, and/or monitoring features implemented through software components may provide reasonable protection against attempts to digitally access information from hard drives or other physically discrete storage medium while connected to a network. Such software components, however, may lack the ability to detect or indicate whether a hard drive has been physically intercepted for accessing or tampering with hardware components, such as during transit of such hard drives from place to place or when otherwise not connected to a network.

BRIEF DESCRIPTION OF THE DRAWINGS

Various embodiments in accordance with the present disclosure will be described with reference to the drawings, in which:

FIG. 2 illustrates features of a tamper detection system that may be implemented in the system of FIG. 1 according to various embodiments;

FIG. 3 illustrates a detail view of a subassembly from FIG. 2 in a position releasably secured to a rack according to various embodiments;

FIG. 4 illustrates features of the tamper detection system of FIG. 2 in a released state that permits access to the rack according to various embodiments;

FIG. 5 illustrates a detail view of a subassembly from FIG. 4 in the released state according to various embodiments;

FIG. 6 illustrates various bars of a tamper detection system that may be implemented in the system of FIG. 1 according to various embodiments;

FIG. 7 illustrates an example of features of the bars of FIG. 6 that can connect to one another for use according to various embodiments;

FIG. 8 illustrates a rear view of a connector pad that may be utilized to connect bars of FIGS. 6-7 to one another or the rack according to various embodiments;

FIG. 14 illustrates a plug and socket arrangement that may be utilized to connect the bars of FIGS. 6-7 to one another or the rack according to various embodiments.

DETAILED DESCRIPTION

Figure 1:
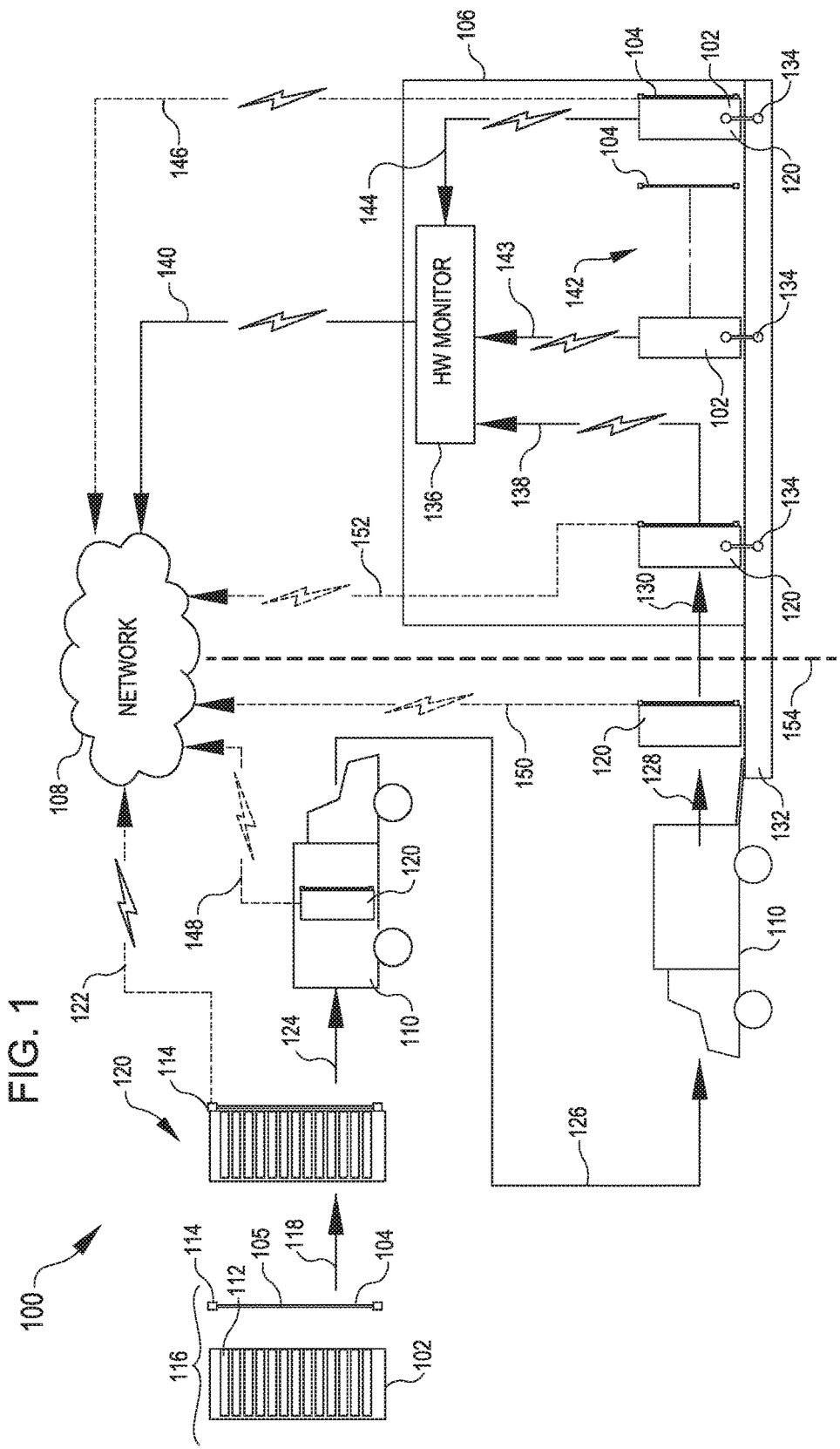
FIG. 1 illustrates a system in which features are implemented for obtaining evidence of tampering relative to a rack bearing computer servers or other appliances according to various embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described herein include use of physical barriers to restrict access to computer servers or other appliances received in a rack. Movement or severing of a barrier to gain access to the rack results in a detectable change in an electrical characteristic of an electrical component in or otherwise associated the barrier. Such an electrical characteristic change causes a detector to log, transmit, or otherwise generate an indication that tampering has occurred, for example, so that tampered with electronics can be wiped, so that appropriate personnel can be alerted to investigate the breach, or so that other appropriate action can be taken.

In an example embodiment, the barrier is a mesh having conductive material running through it. The mesh is attached to a server rack by bands around the edges. The bands have a magnetic layer that hold the bands against the rack, for example, to facilitate alignment while a backing layer is removed to expose an adhesive layer for placement against the rack. Metal traces through the adhesive layer establish a circuit by connecting the conductive material in the mesh to other conductive material in the mesh or to the rack. A detector within the circuit (e.g., integrated into the mesh or situated on the rack) detects an initial value of an electrical characteristic of the circuit, such as resistance, capacitance, electromagnetic signal propagation, continuity, or a number of identification tags that are detectable within the circuit. Cutting the mesh (e.g., severing the conductive material therein) or pulling the mesh away from contact with the rack (e.g., causing parts of the metal traces in the adhesive layer to be destroyed) will thus disrupt or alter connectivity within the circuit and result in a different value for the electrical characteristic being sensed by the detector. In response to this change, the detector logs and/or transmits an indication that the mesh has been tampered with.

In another example, the barrier includes a bar having conductive material running through it. When mounted to the rack, the conductive material forms part of a circuit and affects an electrical characteristic of the circuit. When the bar is detached from the rack or severed, the electrical characteristic changes in a manner that is detectable by a detector to trigger logging or transmitting of an indication that the bar has been tampered with.

In a further example, the barrier includes a bar with a circuit having a switch. The switch is coupled with a magnet and held in one position when the magnet is engaged with a metal portion of the rack (e.g., magnetically coupling the bar to the rack in position blocking access to servers on the rack). The switch is also spring-loaded so that pulling the bar away from the rack will disengage the magnetic hold and allow the spring to push the switch into a different position and trigger transmission or logging of an indication that the bar has been tampered with.

Referring now to the figures, FIG. 1 illustrates a system 100 in which tamper-evident systems may be utilized. The system 100 in FIG. 1 is illustrated with a server rack 102, a tamper detection system 104, a datacenter 106, a network 108, and transport vehicles 110.

In operation, a server rack 102 can include one or more appliances 112. In some embodiments, the appliance 112 corresponds to a server and/or network hardware components for the datacenter 106. The appliances 112 may be mounted in the rack 102 in drawers or on rails or in other arrangements that allow the appliances 112 to be accessible from a face of a rack 102. For example, a slide-out drawer may be pulled from the front of the rack 102 to facilitate making cable connections or performing other maintenance operations.

Generally, the tamper detection system 104 or components thereof can be coupled with the rack 102 to prevent or detect access to the appliances 112 apart from specifically authorized instances. The tamper detection system 104 shown in FIG. 1 is shown schematically as a barrier 105 having a detector 114 coupled therewith. The detector 114 can include suitable components to permit the detection of separation of the barrier 105 from the rack 102 in a way that would allow access to the appliances 112. In some embodiments, the barrier 105 can include electrically conductive material that forms part of a circuit when the barrier 105 is installed on the rack 102, and the circuit may exhibit an electrical characteristic that may change in a manner detectable by the detector 114 when the barrier 105 is disconnected from the rack 102 or severed between points of attachment to the rack 102. Suitable electrical characteristics may include but are not limited to resistance, capacitance, electromagnetic signal propagation, continuity, or a number of identification tags that are detectable within the circuit. For example, severing or disconnecting the barrier 105 may in effect remove a resistor in parallel or in series in the circuit and thus result in a different resistance detectable by the detector 114. As another example, severing or disconnecting the barrier 105 may disconnect a portion of a circuit that has identification tags in it such that the position of the disruption may be ascertained based on which identity tags are no longer detectable within the circuit (e.g., which unique serial numbers are no longer being returned by queries through the circuit).

The detector 114 can thus provide a tamper-evident indication when the rack 102 is made accessible subsequent to initial installation of the tamper detection system 104. In the illustrative example shown in FIG. 1, the rack 102 and tamper detection system 104 can be provided separately, e.g., as at 116. After mounting, e.g. at 118, the rack 102 and tamper detection system 104 may be transported as a combined unit 120. For example, the barrier 105 of the tamper detection system 104 may be mounted so that it extends across the rack 102 and in front of one or more of the appliances 112 received in the rack 102.

In operation, the detector 114 can communicate with the network 108 at suitable times either directly or by suitable intervening components. For example, the detector 114 can provide an initial status reading to the network 108 (e.g., as at 122) about an electrical characteristic of the tamper-evident assembly detected by the detector 114. In some aspects, the detector may store such information in addition to or in lieu of initially providing the information to the network 108. Generally, the detector 114 may log and/or transmit information as suitable.

The tamper detection system 104 may suitably log or otherwise provide indication of tampering when combined unit 120 is transported to a location from another location, such as from an original equipment manufacturer to a datacenter or from one datacenter to another datacenter or other such transportation situations. The combined unit 120 may be transported in a transport vehicle 110 and loaded into the transport vehicle as at 124 such as to depart from an original equipment manufacturer for transport. In some situations, the transport vehicles 110 may correspond to third party couriers that are not affiliated as a direct subsidiary of the service provider that will ultimately use the rack 102 for providing computing services. For this reason or others, it may be beneficial to provide the tamper detection system 104 to provide measures that can confirm that the appliances 112 have not been physically accessed or tampered with during transit. The combined unit may include any suitable battery or other power source, which may be selected based at least in part on criteria such as an amount of power expected to be consumed for operating the detector 114 during the duration of transit.

The transport vehicles 110 may transport to a datacenter 106 as at 126 and be unloaded at the datacenter as at 128. The combined unit 120 can be inducted into the datacenter as at 130. For example, this may include moving the combined unit 120 into the building of the datacenter 106 from a loading dock 132 and/or plugging in or otherwise establishing connections 134 (such as for transmission of power or data or establishing connection with other infrastructure in the datacenter 106).

In various aspects, the datacenter 106 can include a hardware monitor system 136 which may be any suitable combination of hardware or software. Hardware monitor system 136 can monitor appliances 112 and the racks 102 or combined units 120. Any suitable communication infrastructure protocol may be utilized for such communication, including, but not limited to, WiFi, ethernet cables, or the like.

In one illustrative example, upon being inducted into the datacenter (as at 130), the combined unit 120 provides (e.g., as at 138) information to the hardware monitor system 136 about any indications that the tamper detection system 104 detected that tampering occurred in transit. For example, this may occur automatically in response to the detector 114 sniffing for known or expected WiFi networks or initiation protocols to cause the combined unit 120 to convey information to the hardware monitor system 136 upon being inducted (as at 130) into the datacenter 106. The hardware monitor 136 can in turn communicate with the network 108, as at 140. This communication can, for example, allow for checking against registries for particular appliances 112 and allow for registries to be updated or otherwise maintained to promote security of computing assets.

In some aspects, tamper detection system 104 can be removed (as at 142) from the rack 102, e.g., leaving the rack 102 connected in the datacenter 106 via a connection 134 without the tamper detection system 104 continuing to be used. In such aspects, the rack 102, absent the tamper detection system 104, may communicate with the hardware monitor 136 (as at 143) to facilitate additional monitoring of appliances 112 within the datacenter 106.

Additionally or alternatively, a combined unit 120 may be maintained within the datacenter 106 with a rack 102 outfitted with a tamper detection system 104 to maintain ongoing monitoring functions. For example, the tamper detection system 104 may include an interface that allows for power to be received through a connection 134 such that a battery included in the tamper detection system 104 may be supplemented by other power sources to allow the tamper detection system 104 to provide ongoing monitoring or alerts if tempering is detected via a change in the barrier 105 or other component in the tamper detection system 104. For example, the combined unit 120 may continue to communicate (as at 144) or directly with the network (as at 146). Thus, it will be appreciated that the tamper detection system 104 may be utilized before and/or after a transition (illustrated by line 154) of a rack into service at a datacenter 106.

In various examples, the initial characteristic detected by the detector 114 may be stored in the network 108 or in the detector 114 and compared with a subsequent communication to the network 108 to determine if tampering has occurred. Moreover, communication of the detector 114 with the network 108 is not limited to being within the datacenter 106. For example, as illustrated at 122, the detector 114 may provide information about an initial state etc. before transport (as at 122), during transport (as at 148), upon arrival at the datacenter 106 and before being inducted at 130 (as at 150) or following inducting at 130, but before, or apart from, any communication via the hardware monitor 136 (as at 152). The tamper evident assembly 104 may include any suitable transmitters or receivers or other components to facilitate any of such communications.

FIG. 2 illustrates an example of a system 200 for tamper evidence. The system 200 is an example of the tamper detection system 104. The system 200 includes a rack 202 (housing appliances 212) and a barrier 204 that features a bar 206 and a detector 214. The bar 206 can be an elongate bar. The bar 206 can be received in a bracket 208. For example, as shown in FIG. 1, one end of the bar 206 can be received in the bracket 208 while an opposite end of the bar 206 is attached to the rack 202 by another technique, such as that which will be better understood with reference to FIG. 3.

FIG. 3 shows a detail view of the detector 214 in the position from FIG. 2. In FIG. 3, the bar 206 is releasably secured to the rack 202. As shown in FIG. 3, the detector 214 includes a housing 216, a magnet 218, a switch 220, a battery 222, a spring or other biasing mechanism 222, a lever arm 224, a processing unit 226, and a circuit 228. The switch 220 can be actuatable between a first state (e.g., shown in FIG. 3) and a second state (e.g., shown in FIG. 5) to respectively disconnect or complete a portion of the circuit 228.

The magnet 218 can function to releasably secure the bar 206 with the rack 202 in the arrangement in which the bar 206 blocks access to the appliance 212 received in the rack 202. The magnet 218 is also coupled with the switch 220 (e.g., via lever arm 224) such that while the magnet 218 is coupled with the rack 202, the switch 220 is maintained in a first state shown in FIG. 3 (as opposed to a second state shown in FIG. 5). The magnet 218 while magnetically coupled to the rack 202 can maintain the switch 220 in this first state against a biasing force of a biasing mechanism 222 that is also acting on the switch 220.

FIG. 4 illustrates the bar 206 in a position pivoted away or otherwise detached and released from a position blocking access to the appliances 212. For example, in the position shown in FIG. 4, an appliance 212 may be capable of moving out of the rack 202 due to the absence of the bar 206 obstructing engagement over the path along which the appliance 212 slides in and out of the face of the rack 202. Although the bottom end of the bar 206 is shown pivoted in the bracket 208, it may instead be translated away from the rack 202 as a whole.

FIG. 5 shows a detail view of the detector 214 in the position from FIG. 4. FIG. 5 illustrates the detector in the absence of the rack 202 or other metal member. In this view, the magnet 218 is no longer providing a force to bias the switch 220 against the biasing force of the biasing mechanism 222 and so the circuit 228 is allowed to close and trigger the processing unit 226 to log or transmit an indication that tampering has occurred.

Other variations are possible. For example, although the detector 214 is shown at a top of the bar 206, placement at a bottom or other location of the bar 206 may also be suitable. Additionally or alternatively, rather than having components received within a housing 216 mounted to the bar 206, the detector 214 may include some or all components incorporated into the rack 202 or other component of the system 200.

FIG. 6 illustrates another system 300 that is an example of the tamper detection system 104 of FIG. 1. The system is shown having a plurality of bars 304 arranged relative to a rack 302 having appliances 312. The system 300 is also shown with connectors 328 (depicted as connector pads or patches 328) for connecting respective bars 304 to one another or to the rack 302. The connector pads 328 may additionally or alternatively be utilized as a terminus at an end of a respective bar 304, such as to complete a circuit through conductive elements 316 and 318 of the bar 304.

The depicted system 300 also includes an indicator light 315. For example, the indicator light may be coupled with the detector 314 so that the light 315 can produce a response to an indication from the detector 314 that tampering has occurred. As non-limiting examples, the indicator light may light (e.g., turn on), turn off, or otherwise change a light presentation based at least in part on the detector 314 providing an indication that tampering has occurred relative to a bar 304. Moreover, although the light 315 is shown solely with respect to the tamper detection system 300 depicted in FIG. 6, a comparable component can additionally or alternatively be included in other systems discussed herein, such as in tamper evident systems 104, 200, or 400.

Referring to FIG. 7, the depicted bars 304 include conductive elements 316 and 318, which are shown terminating at respective terminals 320 and 322 (e.g., by ends of the bars 304). In operation, the terminals 320 and 322 may be arranged perpendicularly to the conductive elements 316, 318 such that one instance of the bar 304 may be aligned perpendicularly with another instance of the bar 304 to cause the terminals 320 and 322 to line up with corresponding conductive elements 316 and 318, such as illustrated by arrows 324 and 326.

Although FIG. 7 depicts the bars 304 with elements that facilitate coupling of the bars 304 directly to one another, the bars 304 may be coupled to one another and/or the rack 302 by any suitable technique that establishes an electrical connection for forming a circuit that can facilitate detection of tampering. For example, a bar 304 may be coupled by a connector that is separate or distinct from the bar 304 or by one that is at least partially incorporated into the bar 304. Moreover, the bar 304 may be coupled by components that are destructible by separation so as to be suitable only for a single instance of coupling, or the bar 304 may be coupled by components that are suitably removable and robust to permit multiple instances of coupling and detachment. For example, although bars the 304 in FIG. 6 are shown joined by connectors 328 (which may include additional features shown in FIG. 8 that may be suitable for tampering detection related to "one-time" attachment and detachment), the bars 304 could additionally or alternatively be joined by other components (which may include, but are not limited to features shown in FIG. 14 that may be suitable for tampering detection related to "multiple-time" attachment and detachment).

Referring to FIG. 8, the connector pads 328 may be included, for example, to facilitate connection between one bar 304 and another, or between one bar 304 and the rack 302. The connector pad 328 can include an adhesive portion 342 to aid attachment to the rack 302 or other bar 304. As shown in FIG. 8, the connector pad 328 may include a first trace 332 and a second trace 334 that have respective contact points 336, 338. The first trace 332, the second trace 334, and respective contact points 336, 338 are depicted in FIG.

8 along one side, e.g., a backside 330, of the connector pad 328. This may correspond to the first trace 332, the second trace 334, and/or the contact points 336, 338 being exposed along the back side 330, e.g., to allow the contact points 336, 338 to contact a bar 304 or rack 302 on the back side 330 when the connector pad 328 is coupled thereto. Alternatively, the first trace 332, the second trace 334, and/or the contact points 336, 338 may be embedded within the connector pad 328, e.g., visible through the adhesive portion 342 if present.

Figure 9:
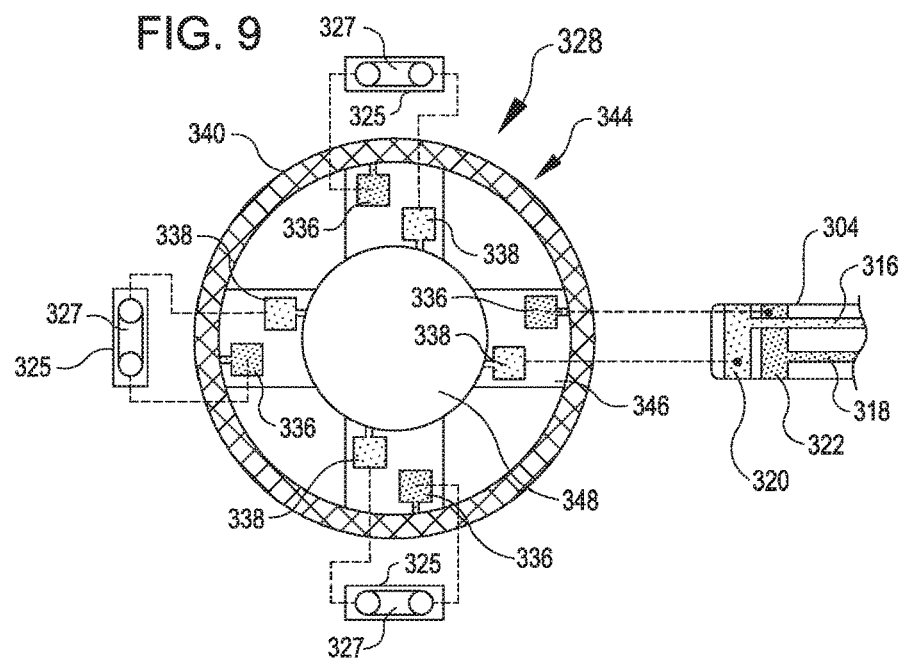
FIG. 9 illustrates a front view of the connector pad of FIG. 8 according to various embodiments.

FIG. 9 illustrates a front side 344 of the connector pad 328. In the depicted arrangement, the front side 344 includes channels 346 or other suitable receptacles for connecting to terminals 320 or 322 of the bar 304. As depicted at the right side of FIG. 9, the channels 346 on the front side 344 of the contact pad 328 can connect the terminals 320 or 322 of the bar 304 to respective contact points 336 and 338 of the contact pad 328, which can establish electrical connection, for example, from one conductive element 316 to the other conductive element 318 on the bar 304; between the bar 304 and the rack 302 (e.g., if any of the contact points 336 or 338 are exposed from the back side 330 of the contact pad 328 to be mounted to the rack 302); or between the bar 304 and another bar 304 (e.g., if any of the contact points 336 or 338 are exposed from the back side 330 of the contact pad 328 to be mounted to another bar 304). In some embodiments, terminators 325 can alternatively be plugged into channels 346 unoccupied by bars 304 and may include bridges 327 that can provide suitable connection between respective contact points 336 and 338 for completing a circuit. For example, the bridges 327 may correspond to conductive wiring. Additionally or alternatively, the bridges 327 may include resistors, identification tags, modulators, or other components that may themselves alter an electrical characteristic of the completed circuit.

The front side 344 of the connector pad 328 depicted in FIG. 9 also includes a push button 348 to move adhesive 342 on the rear side 330 (FIG. 8) into engagement with the rack 302 or other bar 304 (FIG. 6). Additionally or alternatively, the connector pad 328 can include a magnetic anchor 340 in the form of a ring or other suitable form factor to aid attachment to the rack 302. In operation pulling one bar 304 apart from another bar 304, from the rack 302, or from a connector pad 328 may break an electrical contact therebetween such that an electrical characteristic will change within the network formed by the various bars 304 and/or the rack 302. This change may be detected by the detector 314 and logged or transmitted to provide an indication of tamper evidence. Additionally, if bars 304 are retained with a connector pad 328, but the connector pad 328 is separated from the rack 304 or another bar 304, the resulting break in the contact between the contact points 336, 338 of the attached component may cause the respective change in the electrical characteristic that will be detectable by the detector 314. For example, if the contact point 336, 338 are exposed on the bottom side 330 (FIG. 8) of the connector 328, pulling the connector 328 away from a surface to which it is mounted may likewise pull the contact points 336, 338 out of contact with that surface and disrupt the circuit. Additionally or alternatively, a portion of the circuit may be arranged within the adhesive so that the circuit will be broken in response to breakage of a bond that the adhesive 342 provides to establish a bond for mounting the barrier in place. For example, the first trace 332 and the second trace 334 may be arranged within the adhesive 342 so that pulling the connector 328 away from a surface (e.g., of the rack 302 or other bar 304) on which the connector 328 is mounted will cause one part of the circuit (e.g., the first trace 332) to remain attached to the connector 328 while another part of the circuit (e.g., the second trace 334) remains attached to the surface.

FIG. 14 illustrates another arrangement that may be utilized for establishing a circuit by installation of a barrier relative to a rack 502 (e.g., which is an example of the rack 302). The arrangement depicted in FIG. 14 includes the rack 502, a receptacle assembly 506, and a plug assembly 508. Generally, the receptacle assembly 506 may be mounted on or incorporated into the rack 502 and releasably receive or engage the mating plug assembly 508 to establish the circuit in a baseline state from which tampering can be detected based on deviation from that baseline state.

The depicted receptacle assembly 506 includes a first socket 510A, a second socket 510B, a connection line 512, a regulator 516, and a base plate 518. The connection line 512 is shown connecting the first socket 510A and the second socket 510B. The base plate 518 may be formed from an insulative or non-conductive material to prevent shorting between leads in the first socket 510A and the second socket 510. The regulator 516 may correspond to a resistor, identity tag, or any other component that may affect an electrical characteristic of the circuit for tampering detection.

The depicted plug assembly 508 includes a first pin 520A, a second pin 520B, a separator 522, and a bar 524. The first pin 520A and the second pin 520B can provide electrical connections to the bar 524. The bar 524 may be an example of the bar 304 described with respect to FIGS. 6 and 7. For example, the bar 524 can include a first conductor 526A and a second conductor 526B, which may respectively correspond to the conductive elements 316 and 318 (e.g., FIG. 7). The separator 522 can may be formed from an insulative or non-conductive material to prevent shorting between the first pin 520A and the second pin 520B.

In operation, installing the bar 524 relative to the rack 502 can include inserting the pins 520A and 520B into the sockets 510A and 510B. As a result, the pins 520A and 520B may be connected to one another via the connection line 512, e.g., to complete the circuit. The completed circuit may have a baseline reading that can be used for detecting tampering of the bar 524. In one example, the regulator 516 may correspond to a resistor such that a resistance or impedance in the circuit has a particular value when the plug assembly 508 of the bar 524 has been received in the receptacle assembly 506 of the rack 502 and such that the resistance or impedance will accordingly change in a detectable manner if the plug assembly 508 is removed from the receptacle assembly 506 or if a part of the bar 524 is severed to eliminate the regulator resistor 516 from the detectable or intact portion of the circuit. In another example, the regulator may correspond to an identification tag associated with a unique digital signature or serial number such that unplugging the plug assembly 508 will eliminate the identification tag from the remaining intact portion of the circuit and result in a subsequent query of identification tags yielding a response that is missing the particular identifier of the regulator tag 516 and thereby provide an indication of tampering.

Figure 10:
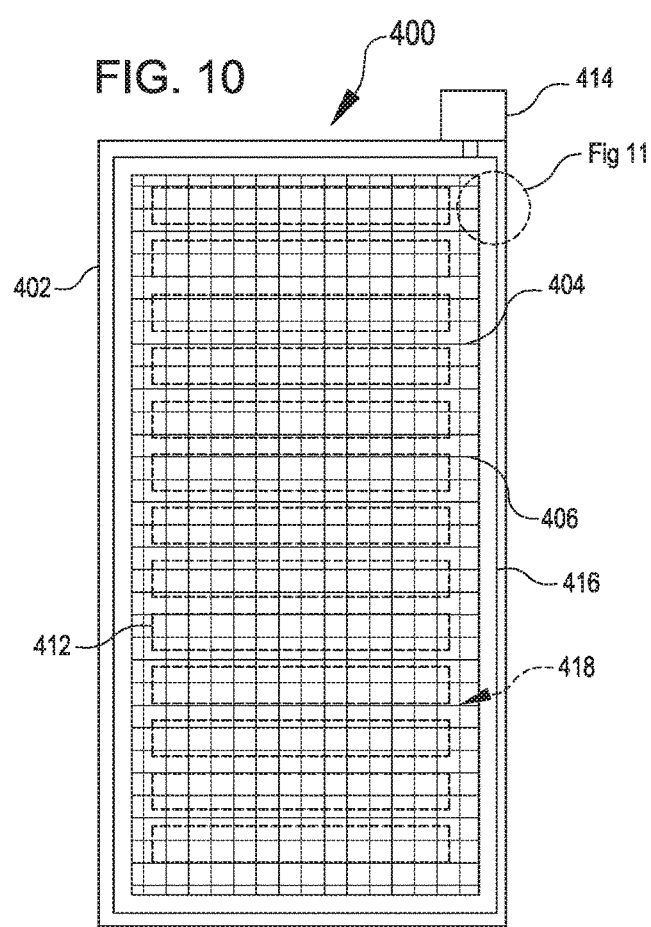
FIG. 10 illustrates a mesh feature of a tamper detection system that may be implemented in the system of FIG. 1 according to various embodiments.
Figure 11:
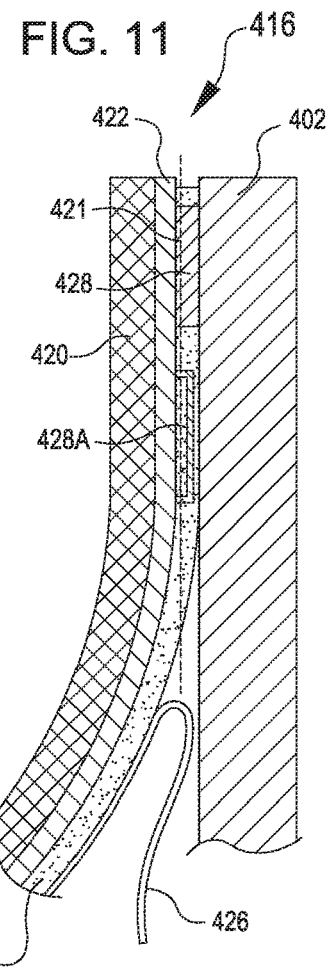
FIG. 11 shows a side view in which a band is at least partially attached to a portion of a rack to secure the mesh of FIG. 10 according to various embodiments.
Figure 12:
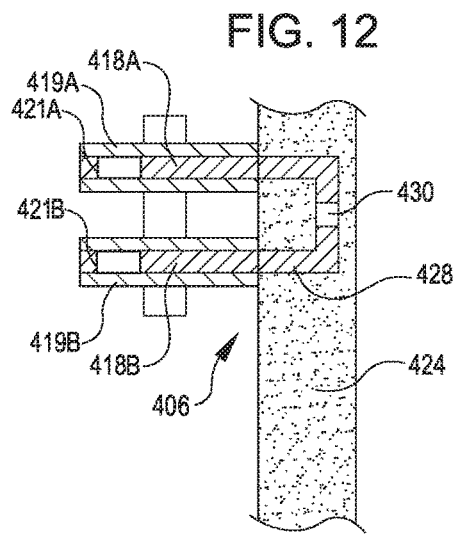
FIG. 12 shows an end view of an adhesive layer of the band of FIG. 11 according to various embodiments.

Although various features (such as the system with a magnet 218 of FIG. 3, the connectors 328 of FIGS. 8 and 9, or the receptacle assembly 506 and mating plug assembly 508 of FIG. 14) have been described with respect to a bar 304, other options are possible, including, but not limited to, utilizing such features with a barrier 104 that includes mesh, such as described herein with respect to FIGS. 10-12.

FIG. 10 illustrates another system 400 that is an example of the tamper detection system 104 of FIG. 1. As shown in FIG. 10, the system 400 is illustrated relative to a rack 402 having appliances 412. The system includes a barrier 404 that is coupled with a detector 414. The barrier 404 includes a mesh 406. The mesh 406 may be flexible (e.g., which may permit stretching relative to relevant features of the rack 402 or may be rigid or semi-rigid (e.g., which may permit moving the mesh 406 much like a door or solid panel during installation or removal). The depicted mesh 406 is bounded by connectors 416 (depicted as bands and hereinafter bands 416) that provide an edge of the mesh 406 by which the mesh 406 can be attached in a position extending over the appliances 412 (although other connectors such as described above may additionally or alternatively be used for connecting the mesh 406 to the rack 402). The bands 416 are shown attached to a front face of a rack 402, but could be additionally or alternatively wrapped to attach to exterior left, right, top, and/or bottom faces of the rack 402 or to interior faces formed by recesses within the rack 402 front face for receiving appliances 412. The mesh 406 can include a conductive element 418 such that when the mesh 406 is severed to provide access to an appliance 412, an electrical characteristic of the mesh 406 will change and provide a detectable electrical feature that can trigger the detector 414 to log or transmit a signal regarding tampering with the system 400. In various aspects, the conductive element 418 is encased within insulative material within the mesh 406, which can reduce a risk of contact between the conductive element 418 and other objects that might result in inadvertent or inaccurate indications of tampering.

FIG. 11 shows a side view in which a band 416 is at least partially attached to a portion of a rack 402. The band 416 as shown in FIG. 11 includes a magnetic layer 420, such as may be useful for maintaining the band 416 in place during installation. Also depicted is an insulated layer 422, for example, which may be included if desired such as to prevent travel of electricity to a surface of the mesh 406 and/or magnetic layer 420 that may be sufficiently exposed to permit contact by a person in proximity to the rack 402. FIG. 11 also shows an adhesive layer 424. The adhesive layer 424 is shown partially covered by a removable lining layer 426 such as a paper strip that can be removed to expose at least a portion of the adhesive layer 424 for attaching to the rack 402. The adhesive layer is also shown having a conductive portion 428 that can establish electrical connection with the rack 402. Suitable materials for such conductive portion 428 may include but are not limited to conductive ink having gold, copper, or aluminum. Also shown is an alternative conductive portion 428A, which may provide a portion of a circuit in contact with the conductive element 418 of the mesh 406 without extending to a position that will contact the rack 402 when the mesh 406 has been installed. In operation, pulling the band 416 away from the rack 402 to gain access behind the mesh 406 can cause some of the adhesive 424 (e.g., to the right of reference line 421) to remain on the rack 402 while another portion of the adhesive 424 (e.g., to the left of the reference line 421) instead sticks to the band 416. As a result of such selective separation of the adhesive, the conductive portion 428 and/or the conductive portion 428A can become severed and disrupt the circuit in a detectable manner.

FIG. 12 shows an back view of the adhesive layer 424 of the assembly shown in FIG. 11. The adhesive layer 424 shown in FIG. 11 includes the conductive portion 428 deposited within it. This construction may lead to severing of the conductive portion 428 when the adhesive portion or other part of the band 416 is pulled away from the rack 402. Other components 430 may be included in the circuit formed by the conductive portion 428. For example, a resistor 430 with a known resistance may be included in order to increase the difficulty with which the overall resistance of the system 400 can be predicted, thereby making it more difficult to falsify or fool the system 400 or work around the elements of the system without leaving a trace of tampering or disrupting the system 400. The conductive portion 428 in the adhesive 424 may be in connection with respective conductive elements 418A and 418B of the mesh 406 to connect respective portions of the circuit and facilitate tamper detection. In one example, respective conductive elements 418A and 418B include respective identification tags 421A and 421B that may each have unique identifiers that may be missing if their respective conductive elements 418 have been severed from the remainder of the circuit when a query of the circuit's electrical characteristic is made. The mesh 406 in FIG. 112 is also shown with insulation 419. In some embodiments, the mesh 406 may be provided with portions exposed without insulation 419. For example, the mesh 406 upon installation relative to the rack 402 may have a capacitance that may change by a detectable amount when a person touches the mesh 406, and the detectable change may cause an indication of tampering to be generated by the detector 414.

Figure 13:
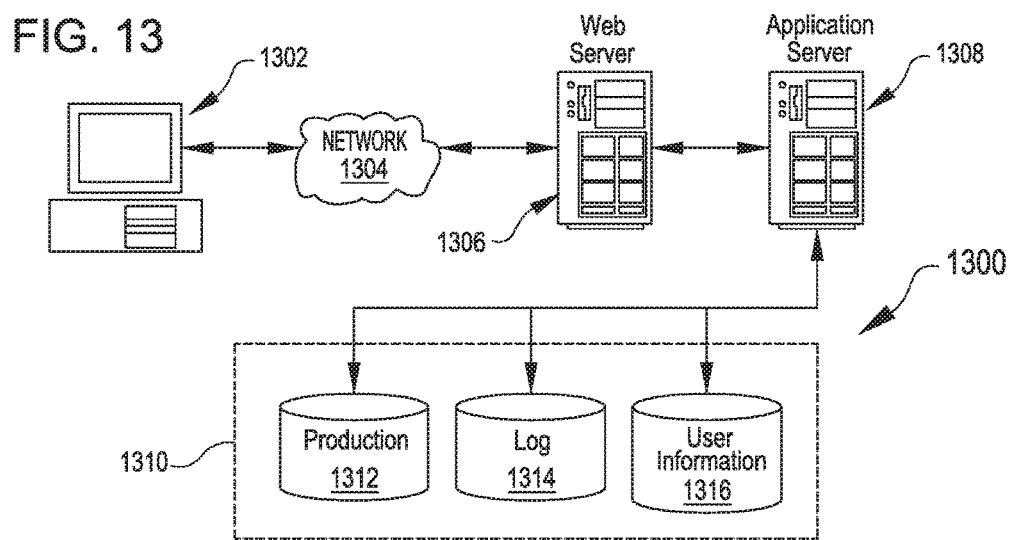
FIG. 13 illustrates an environment in which various embodiments can be implemented according to certain embodiments.

FIG. 13 illustrates aspects of an example environment 1300 for implementing aspects in accordance with various embodiments. As will be appreciated, although a Web-based environment is used for purposes of explanation, different environments may be used, as appropriate, to implement various embodiments. The environment includes an electronic client device 1302, which can include any appropriate device operable to send and receive requests, messages, or information over an appropriate network 1304 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 1306 for receiving requests and serving content in response thereto, although for other networks an alternative device serving a similar purpose could be used as would be apparent to one of ordinary skill in the art.

The illustrative environment includes at least one application server 1308 and a data store 1310. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. The handling of all requests and responses, as well as the delivery of content between the client device 1302 and the application server 1308, can be handled by the Web server. It should be understood that the Web and application servers are not required and are merely example components, as structured code discussed herein can be executed on any appropriate device or host machine as discussed elsewhere herein.

The data store 1310 can include several separate data tables, databases or other data storage mechanisms and media for storing data relating to a particular aspect. For example, the data store illustrated includes mechanisms for storing production data 1312 and user information 1316, which can be used to serve content for the production side. The data store also is shown to include a mechanism for storing log data 1314, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 1310. The data store 1310 is operable, through logic associated therewith, to receive instructions from the application server 1308 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 1302. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 13. Thus, the depiction of the system 1300 in FIG. 13 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method for detecting tampering of a physical access restraint for a rack-mounted datacenter appliance, the method comprising:
   receiving, at a datacenter, a rack equipped with a detector and a barrier coupled with the detector, the barrier comprising a mesh extending across the rack in an arrangement in which the mesh blocks physical access to an appliance received in the rack; and
   accessing the detector coupled with the barrier to obtain information indicating that the barrier has been tampered with between authorized installation of the barrier and receipt of the rack at the datacenter based on a change in an electrical characteristic of a component of the barrier relative to an initial state of the electrical characteristic of the component detected by the detector in association with the authorized installation of the barrier.

2. The method of claim 1, further comprising:
   conducting an authorized installation of the barrier, including:
      installing the barrier by coupling the mesh of the barrier across the rack in the arrangement in which the mesh blocks physical access to the appliance received in the rack;
      coupling the barrier with the detector; and causing the detector to detect the initial state of the electrical characteristic of the component of the barrier; and causing the rack equipped with the detector and barrier to be transported to the datacenter;

wherein in transit the detector is operable to detect the change of the electrical characteristic of the component resulting from the barrier being severed or physically moved out of blocking engagement across the appliance.

3. The method of claim 1, wherein the mesh further comprises:

an electrically conductive element extending through the mesh; and a band at an edge of the mesh and configured to electrically connect the electrically conductive element into a circuit that is completed by the band coupling the mesh to the rack;

wherein the change in the electrical characteristic detectable by the detector comprises a change in an electrical characteristic of the circuit corresponding to a portion of the circuit becoming severed or disconnected.

4. The method of claim 1, further comprising removing the barrier from the rack following receipt of the rack at the datacenter.

5. The method of claim 1, further comprising coupling the detector with a power source of the datacenter to facilitate ongoing monitoring against tampering of the rack at the datacenter.

6. The method of claim 1, wherein the detector is further configured to transmit, during transit, an indication of tampering.

7. A system comprising:

a barrier comprising a mesh sized to extend across a rack in front of an appliance received in the rack;

an electrically conductive element extending at least partially through the mesh and electrically coupleable with a circuit;

a connector configured for releasably securing the mesh to the rack, wherein the connector comprises at least one of:

an electrical connector configured for electrically connecting the electrically conductive element into the circuit;

a magnetic element configured for releasably securing the mesh to the rack; or an adhesive layer configured for releasably securing the mesh to the rack; and a detector configured to generate, in response to a change in an electrical characteristic of the circuit, an indication that the barrier has been tampered with.

8. An assembly comprising:

a rack;

an appliance received in the rack;

a barrier comprising a mesh sized to extend across the rack in an arrangement in which the mesh blocks access to the appliance received in the rack;

an electrically conductive element extending at least partially along the mesh;

a connector coupling the mesh to the rack and electrically connecting the electrically conductive element into a circuit that is completed by the connector coupling the mesh to the rack; and a detector configured to log or transmit, in response to a change in an electrical characteristic of the circuit corresponding to a break in the circuit, an indication that the barrier has been tampered with.

9. The assembly of claim 8, wherein the appliance comprises a computer server or network component.

10. The assembly of claim 8, wherein the electrical characteristic of the circuit comprises a resistance or impedance present in the circuit.

11. The assembly of claim 8, wherein the electrical characteristic of the circuit comprises a capacitance present in the circuit.

12. The assembly of claim 8, wherein the electrical characteristic of the circuit comprises an electromagnetic signal propagated in the circuit.

13. The assembly of claim 8, wherein the electrical characteristic of the circuit comprises a continuity present in the circuit.

14. The assembly of claim 8, wherein the change in the electrical characteristic of the circuit comprises a change in a number of identity indications received from components present in the circuit.

15. The system of claim 7, wherein the connector comprises the adhesive layer configured for releasably securing the mesh to the rack.

16. The system of claim 7, further comprising the rack.

17. The system of claim 7, wherein the electrically conductive element is encased within insulative material within the mesh.

18. The system of claim 7, wherein the connector comprises the electrical connector configured for electrically connecting the electrically conductive element into the circuit.

19. The system of claim 18, wherein the connector comprises:

an adhesive configured to establish a bond for coupling the mesh to the rack; and a conductive trace forming a portion of the circuit and arranged within the adhesive so as to break the circuit in response to breakage of the bond of the adhesive.

20. The system of claim 18, wherein the connector comprises a plug configured for releasably engaging a mating socket of the rack.

21. The system of claim 7, further comprising an indicator light configured to light, turn off, or otherwise change a light presentation based on the detector generating the indication that the barrier has been tampered with.

22. The system of claim 7, wherein the connector comprises the magnetic element configured for releasably securing the mesh to the rack.

* * * * *